(12) United States Patent
Keshner et al.

(10) Patent No.: US 8,026,438 B2
(45) Date of Patent: Sep. 27, 2011

(54) FRONT TRANSPARENT CONDUCTOR ASSEMBLY FOR THIN-FILM PHOTOVOLTAIC CELLS AND METHOD

(75) Inventors: Marvin S. Keshner, Sonora, CA (US);
Paul McClelland, Monmouth, OR (US);
Rajeewa Arya, Beaverton, OR (US);
Gautam Ganguly, Cupertino, CA (US)

(73) Assignee: NovaSolar Holdings Limited, Tortola (VG)

( * ) Notice: Subject to any disclaimer, the term of this patent is extended or adjusted under 35 U.S.C. 154(b) by 735 days.

(21) Appl. No.: 11/947,373

(22) Filed: Nov. 29, 2007

(65) Prior Publication Data

US 2009/0139566 A1    Jun. 4, 2009

(51) Int. Cl.
*H01L 31/0216* (2006.01)
(52) U.S. Cl. ........................................ 136/256
(58) Field of Classification Search .......... 136/243–265; 257/E27.125
See application file for complete search history.

(56) References Cited

U.S. PATENT DOCUMENTS

| | | | |
|---|---|---|---|
| 5,413,864 A * | 5/1995 | Miyazaki et al. | 428/432 |
| 5,527,716 A | 6/1996 | Kusian et al. | |
| 6,222,117 B1 * | 4/2001 | Shiozaki | 136/256 |
| 2005/0008852 A1 * | 1/2005 | Hartig | 428/336 |
| 2008/0105298 A1 * | 5/2008 | Lu et al. | 136/256 |

FOREIGN PATENT DOCUMENTS

EP        0698585 B1    1/1998

* cited by examiner

*Primary Examiner* — Kevin P Kerns
*Assistant Examiner* — Kevin E Yoon
(74) *Attorney, Agent, or Firm* — Schwabe, Williamson & Wyatt, P.C.

(57) ABSTRACT

A front transparent conductor assembly and, in one embodiment, a photovoltaic cell, includes at least three transparent conductor layers. In one embodiment, first and second transparent conductors comprised of $SnO_2$ are positioned above and below a third transparent conductor comprised of $ZnO_2$. In one embodiment, the second transparent conductor layer is significantly thicker than either the first or third transparent conductor layers. In one embodiment of a photovoltaic cell incorporating such an assembly, a sealing layer of $SiO_2$ is interposed between a superstrate and the first transparent conductor. In another embodiment, first and second intermediate layers of $ZnSnO_3$ are incorporated into the assembly, with the first intermediate layer interposed between the first and second transparent conductors and with the second intermediate layer interposed between the second and third transparent conductors.

18 Claims, 3 Drawing Sheets

US 8,026,438 B2

FRONT TRANSPARENT CONDUCTOR ASSEMBLY FOR THIN-FILM PHOTOVOLTAIC CELLS AND METHOD

FIELD OF THE INVENTION

The present invention relates to an improved front transparent conductor assembly for amorphous silicon photovoltaic cells.

BACKGROUND OF THE INVENTION

Prior art thin-film amorphous silicon (a-Si) photovoltaic cells are built on a glass substrate as a series of layers. When the finished cell is operating, the glass substrate becomes a "superstrate"—the top layer through which the sunlight enters. Some of a solar cell's film layers are active (they participate in the actual conversion of light to electricity) and some are passive (they protect the active layers or the substrate). The first active layer deposited (closest to the glass) is usually a transparent conductive layer, such as tin oxide ($SnO_2$). $SnO_2$ is a transparent conductor that conducts current and voltage from the silicon PIN diode deposited thereabove (but located therebelow during operation) that converts sunlight into electricity. Because it is transparent, unlike ordinary conductors like aluminum, the $SnO_2$ layer allows the sunlight to travel from the glass into the silicon.

In addition to its ability to transmit light and conduct electricity, $SnO_2$ also has several other key advantages. It has good adhesion to glass. It also is very resistant to degradation by chemical attack in humid environments. In addition, $SnO_2$ has the right value of work function to make a good contact to the p-layer of the silicon PIN diode that converts the sunlight to electricity. For soda-lime glass of the type typically used in the fabrication of glass superstrates for amorphous silicon photovoltaic cells, the adhesion, electrical properties and optical properties are often improved by coating the soda-lime glass with a very thin layer of $SiO_2$ or $SiOxCy$ that acts as a barrier to keep sodium from the glass away from the $SnO_2$.

However, $SnO_2$ has several disadvantages. First, its resistance is higher and its transparency is not as good as several other well known transparent conductors not used in amorphous silicon photovoltaic cells, such as ZnO. ZnO is inexpensive and abundant, but has several serious disadvantages as compared to $SnO_2$. ZnO tends to be hygroscopic. It readily absorbs water and is easily attacked chemically in a humid environment. When applied to the surface of glass, for a variety of reasons, it adheres poorly and readily peels off the surface of the glass. In addition, ZnO is a soft material that is easily scratched and damaged mechanically.

ZnO has been demonstrated as a possible front conductor for a-Si photovoltaic cells in the laboratory. Tests have shown that the higher transparency and lower resistivity of ZnO produce, in a laboratory setting, photovoltaic cells with higher efficiency. However, the prior art fails to disclose the development of a production process for a-Si photovoltaic cells for use in the field with ZnO as the front conductor that can pass the usual reliability tests without the ZnO front conductor failing.

The present invention is directed to such a cell and a method therefor.

SUMMARY OF THE INVENTION

In accordance with an embodiment of the present invention, an improved transparent conductor assembly for a photovoltaic cell is disclosed. The assembly comprises, in combination: a first coating adapted to be positioned below a superstrate in a photovoltaic cell; a second coating comprising a transparent conductor of a different material than the first coating, positioned below the first coating; and a third coating, comprising a transparent conductor of a different material than the second coating, positioned below the second coating In accordance with another embodiment of the present invention a photovoltaic cell is disclosed. The cell comprises, in combination: a superstrate; a front transparent conductor assembly comprising: a first coating positioned below the superstrate; a second coating, comprising a transparent conductor material different than the first coating, positioned below the first coating; and a third coating, comprising a transparent conductor material different than the second coating, positioned below the second coating; a PIN diode, positioned below the third coating; a back transparent conductor, positioned below the PIN diode; and a reflector, positioned below the back transparent conductor.

In accordance with a further embodiment of the present invention, a method for converting sunlight into electricity is disclosed. The method comprises: providing a photovoltaic cell comprising, in combination: a superstrate; a front transparent conductor assembly comprising: a first transparent conductor positioned below the superstrate; a second transparent conductor, comprising a different material than the first transparent conductor, positioned below the first transparent conductor; and a third transparent conductor, comprising a different material than the second transparent conductor, positioned below the second transparent conductor; a PIN diode, positioned below the third transparent conduct; a back transparent conductor, positioned below the PIN diode; and a reflector, positioned below the back transparent conductor; positioning the photovoltaic cell so that sunlight may enter the superstrate and thereafter pass through the front transparent conductor assembly and the PIN diode, where a portion of the sunlight is converted into electricity; and outputting the electricity from the photovoltaic cell.

DETAILED DESCRIPTION OF THE PREFERRED EMBODIMENTS

Figure 1:
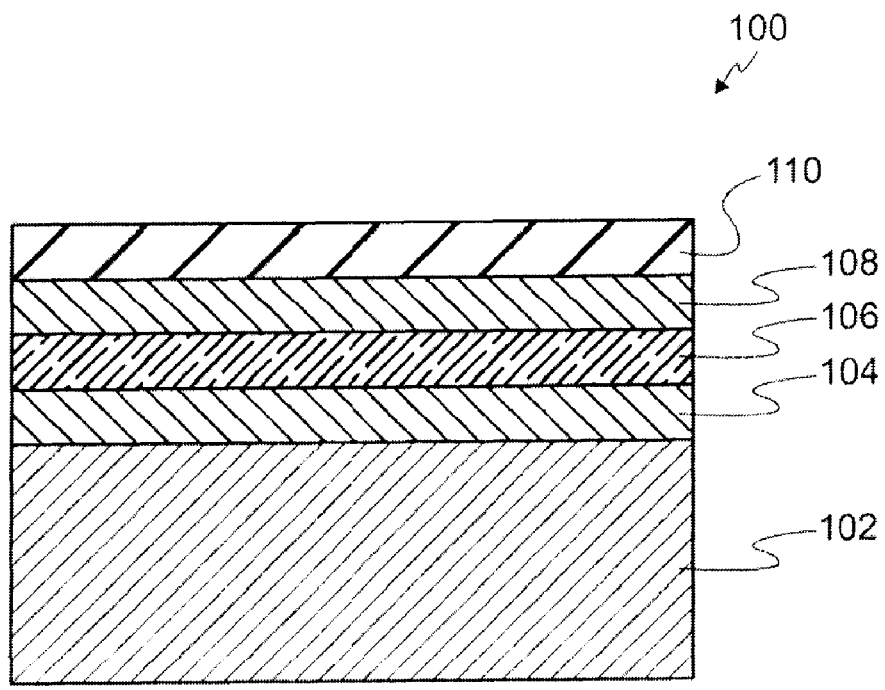
FIG. 1 is side, cross-sectional view of a prior art thin-film, amorphous silicon photovoltaic cell, showing the various layers of materials.

Although this discussion refers to the layers as they are positioned during operation (with the glass as a superstrate), the drawings show the position of the layers during manufacturing (with the glass as a substrate) Referring first to FIG. 1, as noted in the background section above, a prior art thin-film, amorphous silicon (a-Si) photovoltaic cell 100 is illustrated. The photovoltaic cell 100 includes a glass superstrate 102 at an tipper portion thereof Positioned below the superstrate 102 is a front transparent conductor layer 104 comprised of SnO2. Below the transparent conductor layer 104 is the PIN diode 106. A back transparent conductor layer 108 of ZnO is disposed below the PIN diode 106, and an aluminum reflecting layer 110 underlies the entire photovoltaic cell 100. A sealing layer, such as SiO2 (not shown), may be interposed between the superstrate 102 and the front transparent conductor layer 104 to block the diffusion of sodium from the superstrate 102 into the front transparent conductor layer 104.

Figure 2:
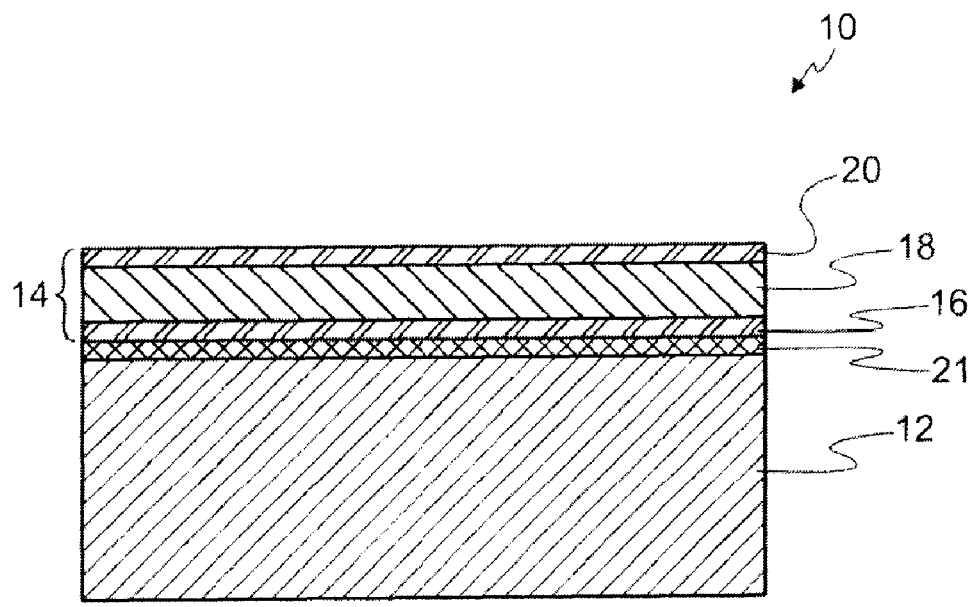
FIG. 2 is a side, cross-sectional view of an upper portion of a thin-film, amorphous silicon photovoltaic cell consistent with an embodiment of the present invention.

Referring now to FIG. 2, an upper portion of a photovoltaic cell 10 consistent with an embodiment of the present invention is illustrated. In this embodiment, a glass superstrate 12 is positioned above a front conductor assembly 14. The front conductor assembly comprises three layers: a first transparent conductor 16, a second transparent conductor 18 and a third transparent conductor 20. In one embodiment, the second transparent conductor is ZnO and the first and third transparent conductors are SnO2. It should be noted that the superstrate 12 may be of the type of glass utilized in the prior art photovoltaic cell 100 of FIG. 1, such as soda-lime glass, including low-iron soda-lime glass.

As illustrated in FIG. 2, it may additionally be desired to interpose between the first transparent conductor 16 and the superstrate 12 a sealing layer 21, which may comprise SiO2. If utilized, the SiO2 sealing layer 21 prevents sodium from diffusing out of the superstrate 12 and into the first transparent conductor 16 and into the front conductor assembly 14 generally. The sealing layer 21 may also act as a seed layer for the growth of the first transparent conductor 16, and also promotes good adhesion between the superstrate 12 and the first transparent conductor 16.

It can be seen that in the embodiment of FIG. 2, a plurality of layers comprising at least two different materials replaces the single layer front transparent conductor 104 of a prior art photovoltaic cell 100. The fir 't transparent conductor 16, where for example comprised of Sn02, provides good adhesion to the superstrate 12 (particular if mediated by a sealing layer 2l) and acts as a barrier layer to protect the second transparent conductor 18, where for example comprised of ZnO, from water vapor.

The third transparent conductor 20, where for example comprised of SnO2, similarly serves to act as a barrier layer to protect the second transparent conductor 18 from the environment, including water vapor. In addition, the third transparent conductor 20 may be the layer upon which the p-layer of the PIN diode (not shown) is deposited. The third transparent conductor should provide good conditions to grow the p-layer with the desired properties and should also have the right value of work function to make an excellent electrical contact to the p-layer. It can be seen that where SnO2 is utilized for the first and third transparent conductors 16 and 20, those conductors provide known and tested interfaces to the superstrate 12 and to the p-layer of the PIN diode (not shown).

In the embodiment illustrated in FIG. 2, the second transparent conductor 18 is thicker than each of the first and third transparent conductors 16 and 20. In one embodiment, it is substantially thicker than each of these layers and, indeed, may be thicker than the combination of the thicknesses of the first and third transparent conductors 16 and 20. The thicker second transparent conductor permits it to dominate both the optical transmission and the electrical conductivity of the photovoltaic cell 10. Moreover, by making the first and transparent conductors 16 and 20 substantially thinner than the second transparent conductor 18, and by making the second transparent conductor 18 of ZnO, the transparency and conductivity are only slightly less than would be obtained by utilization of a front transparent conductor assembly of ZnO alone. In this regard, the amount of light lost in each conductor layer is proportional to its thickness. Because the dielectric constants of SnO2 and ZnO are close to each other, reflectivity losses at the interfaces between these layers are minimal.

By forming the first and third conductor layers 16 and 20 of SnO2 and by making them much thinner than a second conductor layer 18 formed of ZnO, the overall transparency of the assembly 14 is only slightly affected by the first and third conductors 16 and 20, and instead may be dominated by the transparency of the second transparent conductor 18 of ZnO. Similarly, the second transparent conductor 18 may dominate the overall conductivity of the structure. The assembly 14 of FIG. 2 as described herein creates a structure that simultaneously provides good adhesion of SnO2 to the superstrate 12, the improved transparency of ZnO, the improved conductivity of ZnO and the excellent interface properties of SnO2 for the connecting to the p-layer of a PIN diode.

Figure 3:
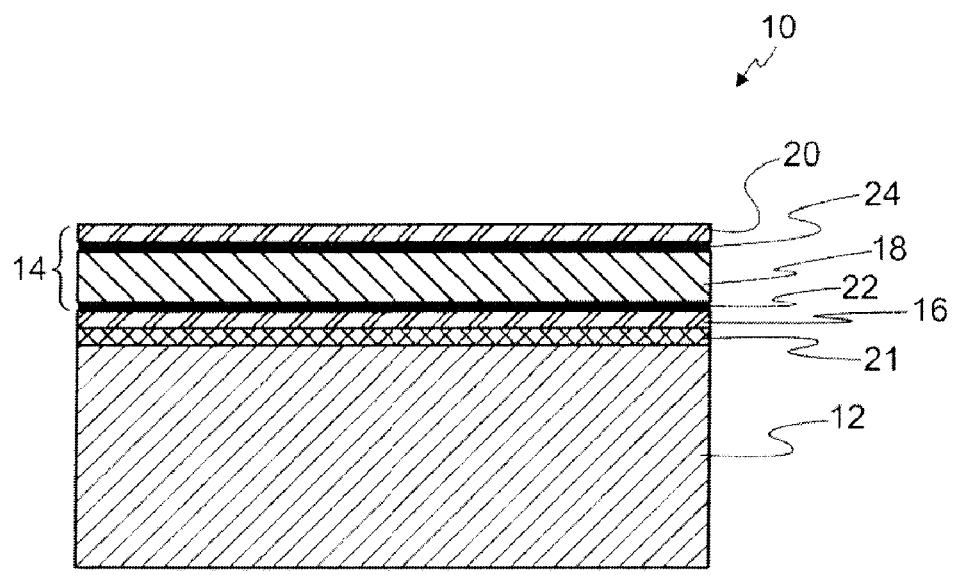
FIG. 3 is a side, cross-sectional view of an upper portion of a thin-film, amorphous silicon photovoltaic cell consistent with another embodiment of the present invention.
Figure 4:
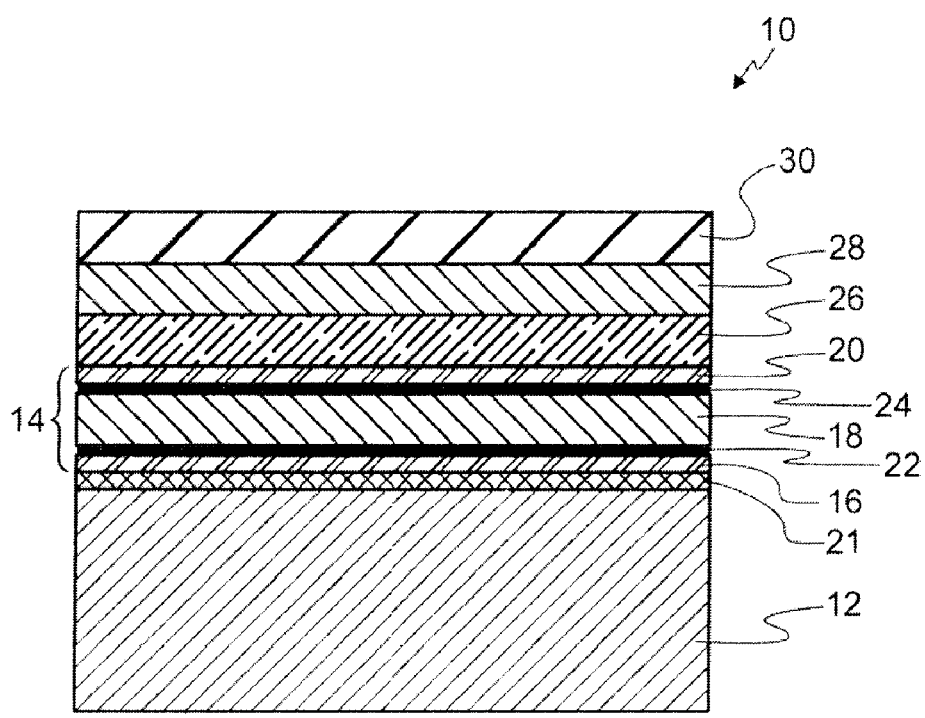
FIG. 4 is a side, cross-sectional view of a thin-film photovoltaic cell incorporating the upper portion shown in FIG. 3.

Referring now to FIGS. 3-4, another embodiment of a photovoltaic cell 10 consistent with an embodiment of the present invention is illustrated. In this embodiment, as in the embodiment of FIG. 2, a superstrate 12 is positioned above a front transparent conductor assembly 14 comprising a first transparent conductor 16, a second transparent conductor 18 and a third transparent conductor 20. In one embodiment, the second transparent conductor is ZnO and the first and third transparent conductors are Sn02. In this embodiment, to improve the adhesion between the layers of the cell 10 even more, and/or to improve the overall electrical and optical properties, the composition can be continuously graded from the first transparent conductor 16, to a first intermediate layer 22 ZnSnO3 at the interface between the first transparent conductor 16 and the second transparent conductor 18, to a second intermediate layer 24 of ZnSnO3 at the interface between the second transparent conductor 18 and the third transparent conductor 20. Optionally, it may additionally be desired to interpose between the first transparent conductor 16 and the superstrate 12 a sealing layer 21, which may comprise Si02.

The p-layer of a PIN diode 26 may be positioned below the assembly 14, a back transparent conductor 28 (which may comprise ZnO) and a back reflector 30 (which may comprise aluminum) also provided as part of the photovoltaic cell 10 (see FIG. 4). As discussed above with respect to the embodiment of FIG. 2, the photovoltaic cell 10 of FIGS. 3-4 includes a second transparent conductor 18, preferably comprised of ZnO, that is significantly thicker than either of the first or second transparent conductors 16 and 20, which preferably comprise Sn02.

Figure 5:
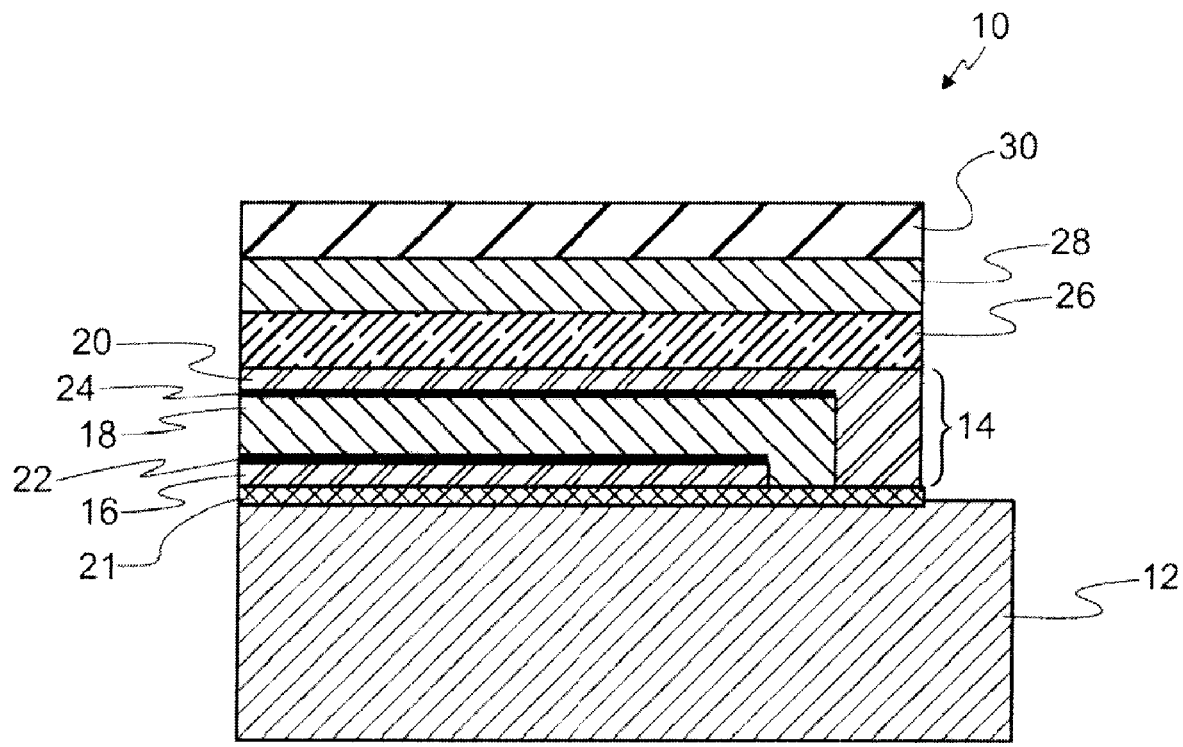
FIG. 5 is a side, cross-sectional view of a thin-film, amorphous silicon photovoltaic cell consistent with another embodiment of the present invention.

Referring now to FIG. 5, still another embodiment of a photovoltaic cell 10 consistent with an embodiment of the present invention is illustrated. In this embodiment, the cell 10 may comprise the same layering as in the cell 10 of FIGS. 3-4. However, as illustrated in FIG. 5, in this embodiment, the second transparent conductor 18, in addition to having the first transparent conductor 16 thereabove and the second transparent conductor 20 therebelow, is also protected on at least one edge by at least one of the first and third transparent conductors 16 and 20. In the embodiment of FIG. 5, edge protection is provided by the third transparent conductor 20. This configuration is intended to provide increased protection of the second transparent conductor 18, particularly when comprised of ZnO, from water vapor and from chemical attack, as compared to a configuration where ZnO is not protected along its edges by SnO2.

Other variations are possible. For example, the first transparent conductor 16 may be replaced in any of the embodiments herein with an insulating, transparent material, such as SiO2, provided that it adheres well to glass and provides the right crystal structure to promote the textured or non-textured growth of the ZnO layer, as desired for a given application. In addition and/or in the alternative, the third transparent conductor 20 may comprise, in any of the embodiments herein, instead of SnO2, another transparent conductor, such as Indium Tin Oxide, Cadmium Tin Oxide or others, provided that they also provide good humidity and chemical protection for the ZnO, adhere well to ZnO and enable a good electrical contact to the p-layer.

As in the prior art, this structure can also be textured by a variety of methods, such as using a non-uniform SiO2 seed layer, using the SiO2 to control the crystal orientation of the SnO2 growth and then the ZnO growth, random nucleation during the film growth, by mechanical means, with a gas phase etchant (similar to using HF gas to texture glass), or by patterning with techniques like photo-enhanced chemical etching.

It should also be noted that this structure can be deposited with or without texture by a variety of traditional methods: atmospheric pressure chemical vapor deposition (ap-cvd), low pressure chemical vapor deposition (lp-cvd) plasma enhanced chemical vapor deposition (pe-cvd) or sputter deposition, possibly at elevated temperatures to enhance the formation of texture when desired.

Although particular embodiments of the invention have been described in detail for purposes of illustration, various modifications may be made without departing from the spirit and scope of the invention. Accordingly, the invention is not to be limited, except as by the appended claims.

We claim:

1. An improved transparent conductor assembly for a photovoltaic cell comprising, in combination:
   a first coating comprising a transparent conductor, adapted to be positioned operationally below a superstrate in a photovoltaic cell;
   a second coating comprising a transparent conductor of a different material than the first coating, positioned operationally below the first coating; and
   a third coating comprising a transparent conductor of a different material than the second coating, positioned operationally below the second coating;
   wherein the second coating having a thickness that is thicker than each of the first coating and the third coating by an amount or amounts configured to enable the second coating to dominate an optical transmission property and an electrical conductivity of the combination of the first, second and third coating;
   wherein either the first coating or the third coating comprises $SnO_2$.

2. The assembly of claim 1, wherein the first coating, comprises SnO2.

3. The assembly of claim 1, wherein the second coating comprises ZnO.

4. The assembly of claim 1, wherein the third coating comprises SnO2.

5. The assembly of claim 1, wherein the first and third coatings each comprises SnO2 and wherein the second coating comprises ZnO.

6. The assembly of claim 1, wherein the second coating is thicker than a combined thickness of the first coating and the third coating.

7. The assembly of claim 1, wherein at least a portion of one of the first coating or the third coating is disposed over a lateral edge of the second coating.

8. A photovoltaic cell comprising, in combination:
   a superstrate:
   a front transparent conductor assembly comprising:
      a first coating comprising a transparent conductor, positioned operationally below the superstrate;
      a second coating comprising a transparent conductor material different than the first coating, positioned operationally below the first coating; and
      a third coating comprising a transparent conductor material different than the second coating, positioned operationally below the second coating,
      wherein the second coating having a thickness that is thicker than each of the first coating and the third coating by an amount or amounts configured to enable the second coating to dominate an optical transmission property and an electrical conductivity of the combination of the first, second and third coating;
   a PIN diode, positioned operationally below the third coating;
   a back transparent conductor, positioned operationally below the PIN diode; and
   a reflector, positioned operationally below the back transparent conductor.

9. The photovoltaic cell of claim 8, wherein the first coating comprises SnO2.

10. The photovoltaic cell of claim 8, wherein the second coating comprises ZnO.

11. The photovoltaic cell of claim 8, wherein the third coating comprises SnO2.

12. The photovoltaic cell of claim 8, wherein the first and third coatings each comprise SnO2, and wherein the second coating comprises ZnO.

13. The photovoltaic cell of claim 8, wherein the second coating is thicker than a combined thickness of the first coating and the third coating.

14. The photovoltaic cell of claim 8, wherein at least a portion of one of the first coating or the third coating is disposed over at least a lateral edge of the second transparent conductor.

15. The photovoltaic cell of claim 12, further comprising a first intermediate layer of ZnSnO3 disposed between the first coating and the second coating and a second intermediate layer of ZnSnO3 at an interface between the second coating and the third coating.

16. A method for converting sunlight into electricity, comprising:
   providing a photovoltaic cell comprising, in combination:
      a superstrate:
      a front transparent conductor assembly comprising:
         a first transparent conductor positioned operationally below the superstrate;
         a second transparent conductor comprising a different material than the first transparent conductor, positioned operationally below the first transparent conductor; and a third transparent conductor comprising a different material than the second transparent conductor, positioned operationally below the second transparent conductor;
         wherein the second coating having a thickness that is thicker than each of the first coating and the third coating by an amount or amounts configured to enable the second coating to dominate an optical transmission property and an electrical conductivity of the combination of the first, second and third coating;

a PIN diode, positioned operationally below the third transparent conduct;

a back transparent conductor, positioned operationally below the PIN diode; and a reflector, positioned below the back transparent conductor;

positioning the photovoltaic cell so that sunlight enter the superstrate and thereafter pass through the front transparent conductor assembly and the PIN diode, where a portion of the sunlight is converted into electricity; and outputting the electricity from the photovoltaic cell.

17. The method of claim 16, wherein the first and third transparent conductors of the photovoltaic cell each comprises $SnO_2$ and wherein the second transparent conductor comprises ZnO.

18. The method of claim 16, wherein the photovoltaic cell further comprises a first intermediate layer of $ZnSnO_3$ disposed between the first transparent conductor and the second transparent conductor and a second intermediate layer of $ZnSnO_3$ at an interface between the second transparent conductor and the third transparent conductor.

* * * * *